(12) United States Patent
Gerlach et al.

(10) Patent No.: US 7,180,952 B1
(45) Date of Patent: Feb. 20, 2007

(54) CODING RATE REDUCTION FOR TURBO CODES

(75) Inventors: Derek Gerlach, Mountain View, CA (US); James M. Gardner, San Jose, CA (US); Vincent K. Jones, IV, Redwood City, CA (US)

(73) Assignee: Cisco Technology, Inc., San Jose, CA (US)

( * ) Notice: Subject to any disclaimer, the term of this patent is extended or adjusted under 35 U.S.C. 154(b) by 743 days.

(21) Appl. No.: 10/636,862

(22) Filed: Aug. 7, 2003

Related U.S. Application Data

(63) Continuation of application No. 09/418,853, filed on Oct. 15, 1999, now Pat. No. 6,628,723.

(51) Int. Cl.
*H04L 27/00* (2006.01)
*H03M 13/03* (2006.01)

(52) U.S. Cl. .................. 375/259; 375/295; 714/786

(58) Field of Classification Search ........... 375/259, 375/295, 262, 265, 341; 370/260, 352, 240, 370/428; 340/146; 341/139, 144, 155; 714/755, 714/786, 701, 795
See application file for complete search history.

(56) References Cited

U.S. PATENT DOCUMENTS

| | | | |
|---|---|---|---|
| 4,032,886 A | 6/1977 | En et al. ................... 714/788 |
| 5,983,384 A | 11/1999 | Ross ......................... 714/755 |
| 6,014,411 A | 1/2000 | Wang ......................... 375/259 |
| 6,122,763 A | 9/2000 | Pyndiah et al. ............. 700/251 |
| 6,189,123 B1 | 2/2001 | Anders Nystrom et al. |
| 6,202,189 B1 | 3/2001 | Hinedi et al. ............... 714/786 |
| 6,304,991 B1 | 10/2001 | Rowitch et al. ............ 714/755 |
| 6,317,065 B1 | 11/2001 | Raleigh et al. ............. 341/139 |
| 6,381,728 B1 | 4/2002 | Kang ......................... 375/265 |
| 6,430,722 B1 | 8/2002 | Eroz et al. .................. 714/755 |
| 6,434,203 B1 | 8/2002 | Halter ........................ 375/262 |
| 6,487,693 B1 * | 11/2002 | Kim et al. .................. 714/786 |

OTHER PUBLICATIONS

Advanced Hardware Architectures, "Turbo Product Codes for LMDS"; 1999 IEEE Radio and Wireless Conference.

\* cited by examiner

*Primary Examiner*—Emmanuel Bayard
*Assistant Examiner*—Lawrence Williams
(74) *Attorney, Agent, or Firm*—Dov Rosenfeld; Inventek; Dan Lang

(57) ABSTRACT

Systems and methods for precisely controlling the amount of redundancy introduced by a turbo encoding process. Bits having predetermined values are introduced into the turbo encoding input stream and then deleted from the turbo encoding output stream. At the receiver end, the bits having predetermined values are reintroduced into the encoded information stream as having been received with a maximum confidence level. Coding rate may be varied by varying the number of bits having predetermined values which are inserted at the encoder input. This scheme permits the amount of redundancy to be varied according to system requirements.

11 Claims, 7 Drawing Sheets

$$\begin{matrix} pu_{00} & d_{01} & d_{02} & d_{03} \\ d_{10} & pu_{11} & d_{12} & d_{13} \\ d_{20} & d_{21} & pu_{22} & d_{23} \\ d_{30} & d_{31} & d_{32} & pu_{33} \end{matrix}$$

*FIG. 7*

CODING RATE REDUCTION FOR TURBO CODES

CROSS REFERENCE TO RELATED APPLICATIONS

The present application is a continuation of U.S. patent application Ser. No. 09/418,853, filed Oct. 15, 1999, now U.S. Pat. No. 6,628,723, which is incorporated herein by reference in its entirety.

BACKGROUND OF THE INVENTION

The present invention relates to digital communication and/or storage systems and more particularly to systems and methods for error control.

Error correcting codes insert redundancy into digital information streams to be transmitted or stored so as to reduce their susceptibility to corruption by noise. Applying an error correcting code at the transmitter permits the receiver to detect and sometimes correct errors induced by noise and/or interference. Some popular types of error correcting codes include convolutional codes, block codes, and Reed-Solomon codes, etc.

An important recent development in the topic of error correcting codes is the discovery of "turbo" codes. These codes typically involve an iterated combination of two or more systematic convolutional or block codes (convolutional or block codes where the encoder output bits include unaltered input bits.) A key feature of turbo codes is the use of an iterated decoding technique where each successive decoding step outputs soft decisions useable as input to the next decoding step. By employing turbo codes, one may approach the limit of channel capacity in the presence of noise set by the Shannon theorem.

A part of the appeal of turbo codes is the commercial availability of turbo encoder/decoder integrated circuits. This frees the system designer from concerning himself or herself with most issues regarding the internal operation of the turbo coder or decoder.

Commercially available turbo encoders typically accept as input blocks of data with a limited number of programmable choices of block size. The number of output bits generated for each input block will depend on the input block size and the amount of redundancy added by the encoder. The redundancy added will depend on a programmable parameter known as the encoder rate, the ratio of input bits to output bits. Again, there are typically a limited number of choices of encoder rates.

A problem arises in that is often desirable to more precisely control the number of output bits generated for each input block. For example, in a TDMA (Time Division Multiple Access) system, it is desirable to match the number of bits generated to the size of a single frame. In an OFDM (Orthogonal Frequency Division Multiplexing) system, it is desirable to match the number of bits to be transmitted to the capacity of a single OFDM burst, or an integer number of such bursts. In this way, an optimal number of such frames or bursts can be transmitted without dispersing bits resulting from a single input block over multiple frames or bursts and without wasting capacity that could be used to include redundancy that would provide additional robustness to noise and/or interference.

What is needed is a system for precisely controlling the degree of redundancy introduced by commercially available turbo encoders to facilitate matching output block size to the capacity of a single TDMA frame or OFDM burst.

SUMMARY OF THE INVENTION

Systems and methods for precisely controlling the amount of redundancy introduced by a turbo encoding process are provided by virtue of one embodiment of the present invention. Bits having predetermined values are introduced into the turbo encoding input stream and then deleted from the turbo encoding output stream. At the receiver end, the bits having predetermined values are reintroduced into the encoded information stream as having been received with a maximum confidence level. Coding rate may be varied by varying the number of bits having predetermined values which are inserted at the encoder input. This scheme permits the amount of redundancy to be varied according to system requirements.

A first aspect of the present invention provides apparatus for encoding information prior to transmission. The apparatus includes a systematic coder that receives data bits as input and provides parity bits as output. Selected ones of the data bits are information bits and carry the information while other ones of the data bits are puncture bits and carry predetermined values. The apparatus further includes a connection to a transmitter system that forwards the information bits and parity bits for transmission but not the puncture bits.

A second aspect of the present invention provides apparatus for decoding information after receipt from a transmitter. The apparatus includes a systematic decoder that receives as input estimation information for data bits and parity bits and outputs estimated values for the data bits as corrected by use of the parity bits. The apparatus further includes a receiver system that develops estimation information for the parity bits and selected ones of the data bits based on a received signal, and a puncture reinsertion control block that provides to the turbo decoder estimation information for the parity bits and selected ones of the data bits, and predetermined values for other ones of the data bits.

Other features and advantages of the invention will become readily apparent upon review of the following detailed description in association with the accompanying drawings.

BRIEF DESCRIPTION OF THE DRAWINGS

FIG. 4 illustrates data bits processed by a turbo coder.

FIG. 7 illustrates information bits, parity bits, and puncture bits processed by a turbo coder according to one embodiment of the present invention.

DESCRIPTION OF SPECIFIC EMBODIMENTS

Figure 1:
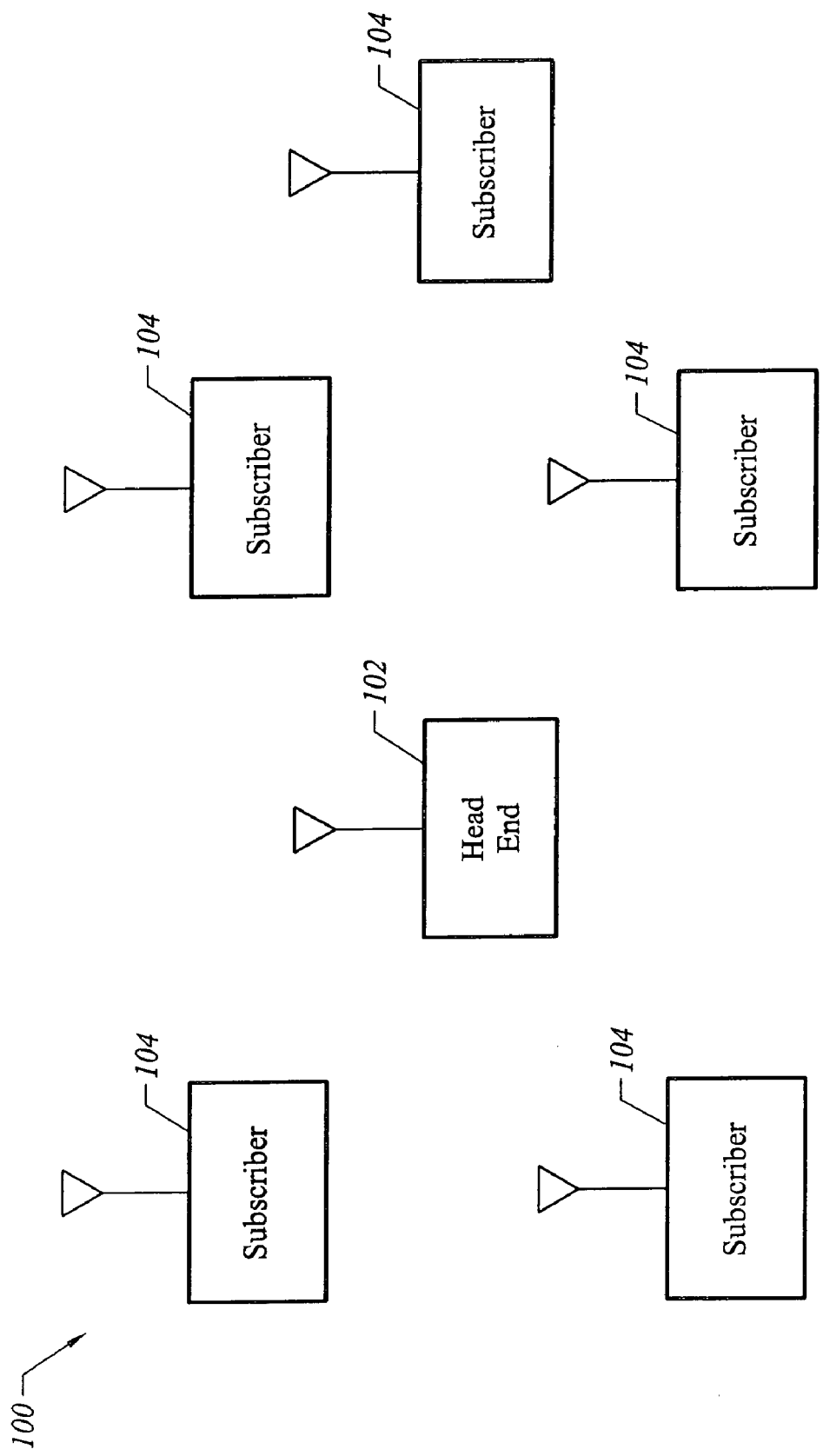
FIG. 1 depicts a point to multipoint network.

FIG. 1 depicts a point to multi-point communication system 100. Point to multipoint communication system 100 includes a headend or central access point 102 and multiple subscriber units 104. Central access point 102 coordinates the operation of communication system 100. All communication is either from central access point 102 to one or more subscriber units 104 or from a subscriber unit 104 to headend 102. Communication from central access point 102 to one or more subscriber units 104 is referred to as downstream communication. Communication from any subscriber unit 104 to central access point 102 is referred to as upstream communication.

In a representative system, downstream communication and upstream communication are allocated separate frequencies. Central access point 102 communicates continuously on one or more downstream frequencies. Subscriber units 104 share access to one or more upstream frequencies. One mechanism for shared access to a common upstream frequency is referred to as TDMA (Time Division Multiple Access). In a TDMA system, for a given upstream transmission frequency, the time domain is divided into slots or frames. Each frame is typically allocated to upstream transmission by a single one of subscriber units 104. In this way, communication from one subscriber unit does not interfere with communication from another subscriber unit. An upstream transmission schedule is developed and propagated by central access point 102. In one embodiment employing Orthogonal Frequency Division Multiplexing (OFDM), each time frame includes a single or integer number of OFDM bursts.

It is desirable to improve the reliability of communication in system 100 by employing high performance error control techniques. Turbo coding provides excellent error control and spectral efficiency in the presence of noise. Turbo codes involve an iterated combination of two or more systematic convolutional or block codes. By employing turbo codes, one may approach the limit of channel capacity in the presence of noise set by the Shannon theorem.

Figure 4:
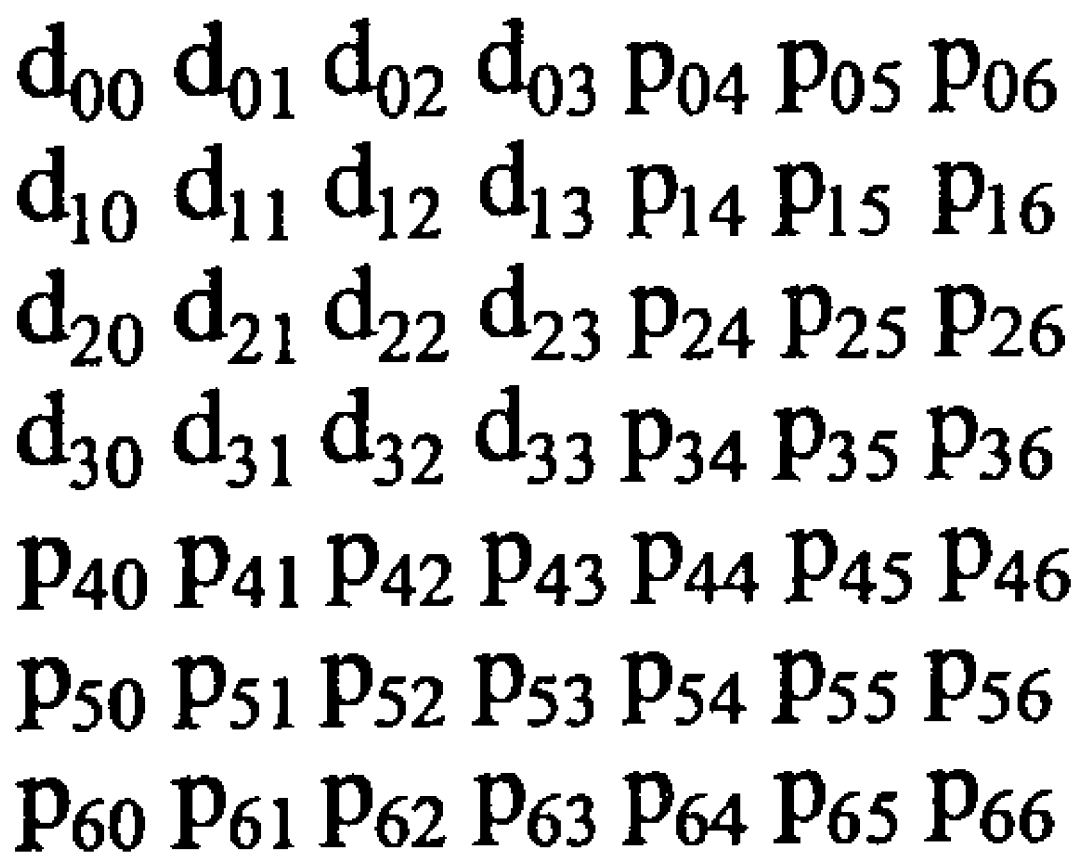
Figure 5:
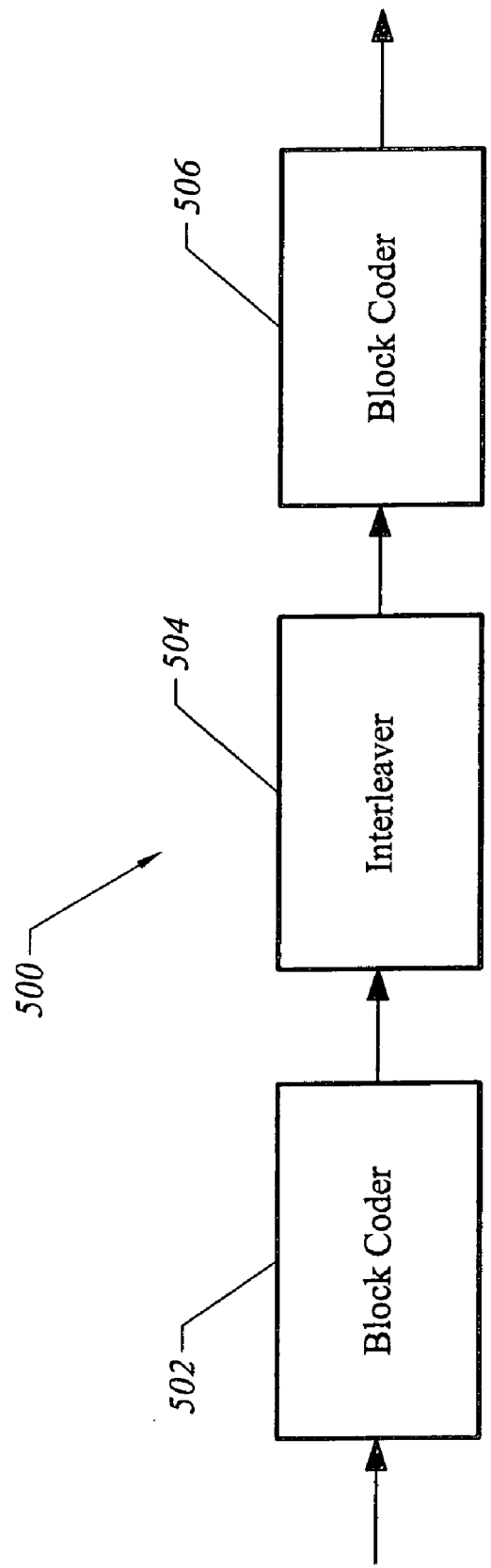
FIG. 5 illustrates internal structure of a turbo coder.

FIG. 5 is a diagram depicting internal structure of a representative turbo coder 500. FIG. 4 depicts data and parity bits processed by turbo coder 500.

Turbo coder 500 operates on a block of 16 data bits organized into four rows and four columns. The actual input block size is programmable. A relatively small block is depicted for convenience in illustration.

In FIG. 4 each data bit is depicted as $d_{xy}$ where x denotes a row and y denotes a column. The data bits are input row by row to a first systematic block coder 502. For each row, block coder 502 provides 3 parity bits based on the four data bits. Each row's parity bits, $p_{ab}$, augment the data bits of the row.

An interleaver 504 rearranges the serial data output by block coder 502 so that data output by interleaver 504 comes out serially column by column. There are seven columns, four columns of the original data input into block coder 502 and three columns of parity generated by block coder 502.

The interleaved data is then input to a second systematic block coder 506 column by column. Block coder 506 provides three parity bits for each column including the three columns that are composed of the parity bits generated by block coder 502. The output of block coder 506 is a block of data including the 16 depicted data bits as well as 33 parity bits.

The rate of the turbo coding scheme depicted in FIG. 4 is 16/49. Of course, many possible rates are possible by varying the number of parity bits generated by block coders 502 and 506 and also by varying the block size of the input data block. It is also possible to provide additional block coding iterations along further axes of an n-dimensional data block where n>2. Note that turbo coder 500 is itself a systematic coder since the input bits form a part of the output. A turbo coding scheme such as this that consists of iterated block codes rather than convolutional codes is often referred to as a product code or a turbo product code.

Figure 6:
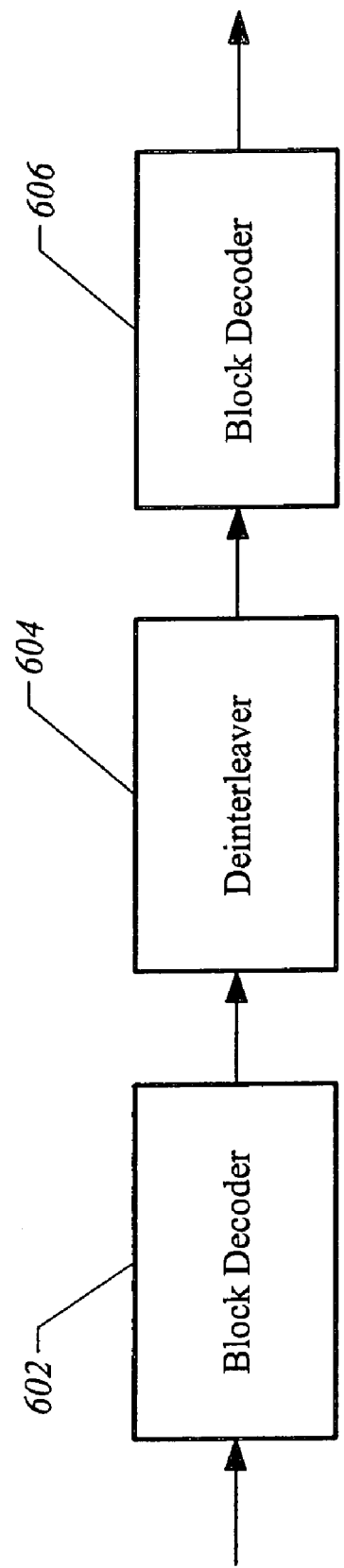
FIG. 6 depicts internal structure of a turbo decoder.

FIG. 6 depicts internal structure of a turbo decoder 600, a type of systematic decoder. At the receive end, a soft decision value or likelihood value is generated for each data bit and parity bit shown in FIG. 4. The soft decision value indicates a receiver estimate of whether the individual bit was transmitted as a 0 or a 1 as well as a confidence value. Soft decision estimates for data parity bits are input on a row by row basis to block decoder 602. Block decoder 602 estimates the data bits and parity bits of each row based on that row's input soft decision information and also generates new soft decision information for the next decoder. A deinterleaver 604 then arranges the bit estimates and soft decision values generated by block decoder 602 so that it outputs serially by column.

A second block decoder 606 then decodes on a column by column basis. Block decoder 606 corrects the top four bit values of each column based on the estimates and soft decision information generated last three bits of each column. If there is to be only one iteration of operating block decoder 602 and block decoder 606 on each input block then the last three columns need not be processed by block decoder 606. It is, however, preferable to operate the components of turbo decoder 600 in an iterative fashion. Then the last three columns are also decoded by block decoder 606. The output results (both soft decision values and estimates) of block decoder 606 are then re-interleaved into rows for further decoding by block decoder 602. For the last iteration, block decoder 606 outputs the estimates for each data bit.

An example of an integrated circuit that may implement either turbo decoder 500 or turbo decoder 600 is the AHA4501 LSI device available from Advanced Hardware Architectures of Pullman, Wash. The input block size for the AHA4501 is programmable from 256 to 4,096 bits. Choices of code rate are limited and include 0.743, 0.495, 0.325, 0.278, 0.724, 0.419, 0.334, 0.660, 0.354, 0.559, and 0.473.

It is desirable, however, to be able to more precisely control the code rate so that the result of applying turbo coding to a block of input data will fill a TDMA frame or an OFDM burst, for example. According to the present invention, one may substitute so-called puncture bits for certain ones of the information carrying data bits of FIG. 4 where the puncture bits have predetermined values. The bit values at the puncture bit positions in the output of turbo coder 500 are then not transmitted, thereby decreasing the code rate. Then at the receiver end, the predetermined values for the puncture bits are reinserted at the input to turbo decoder 600 so that the decoding process will operate correctly.

FIG. 7 depicts a data block input to turbo coder 500 according to one embodiment of the present invention. In comparing the data bits shown in FIG. 7 to those of FIG. 4, it can be seen that certain information carrying data bits $d_{xy}$ have been replaced by puncture bits $pu_{xy}$. The puncture bits are input to turbo coder 500 as data bits but instead of carrying information like the other data bits, the puncture bits carry predetermined values.

Figure 2:
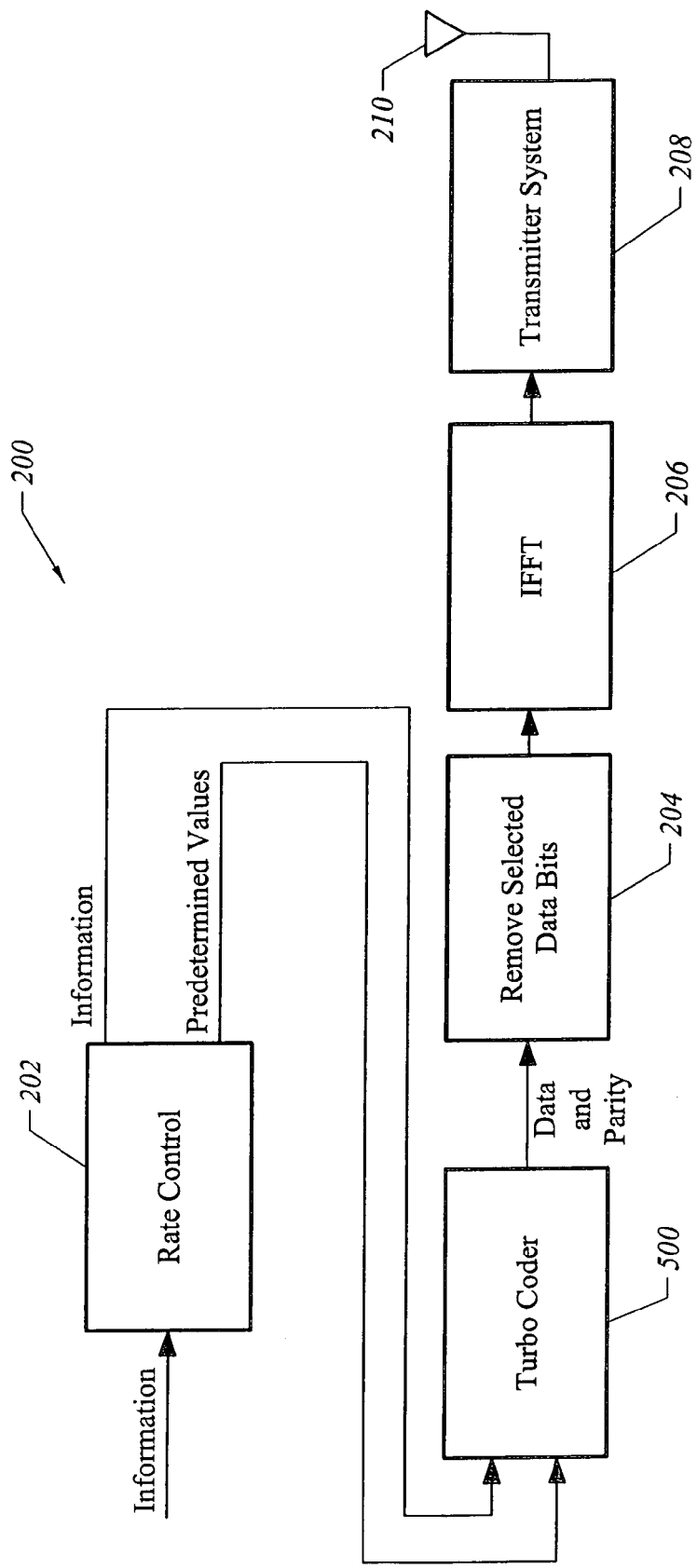
FIG. 2 depicts a block diagram of a transmitter according to one embodiment of the present invention.

FIG. 2 depicts a transmitter 200 according to one embodiment of the present invention. Information to be transmitted is input to a rate control block 202. The information may result from a previous encoding or interleaving process, e.g., a Reed-Solomon decoding process.

Rate control block 202 mixes information and predetermined values to achieve a desired effective code rate for the operation of turbo coder 500. The effective code rate achieved will depend on the ratio of information bits (data bits carrying information) to puncture bits (bits having predetermined values) and the operating code rate of turbo coder 500 itself. To achieve a desired number of output bits to fill a frame or burst, rate control block 202 may vary some combination of ratio of information bits to puncture bits, k input block size, and operating code rate.

Rate control block 202 presents predetermined values at the puncture bit positions and information bit values at the other data bit positions. Turbo coder 500 then operates as described above. Since turbo coder 500 is a systematic coder its output includes the input data bits and adds parity bits.

A deletion block 204 removes the bit values at the puncture bit positions prior to further processing. The remaining information and parity bits are converted to symbols in accordance with a modulation scheme. In one embodiment employing OFDM, the symbols are formed into bursts and each burst is converted to the time domain by an IFFT block 206 that applies the Inverse Fast Fourier Transform and adds a cyclic prefix. The effect of the code rate selected by rate control block 202 will be that a single or integer number of input data blocks to turbo coder 500 will fill a single OFDM burst.

A transmitter system 208 converts the time domain symbols to an analog signal, upconverts the analog signal to an intermediate frequency, performs further processing at the intermediate frequency, and further upconverts the intermediate frequency signal to a radio frequency signal for amplification and transmission via an antenna 210.

In one embodiment, transmitter 200 forms a part of one of subscriber units 104. Transmitter system 208 then transmits only within TDMA frames that have been allocated to it. Rate control block 202 operates so that the bits resulting from a single data block input to turbo coder 500 will fill a TDMA frame or an integer number of such data blocks will cause the frame to be filled.

Figure 3:
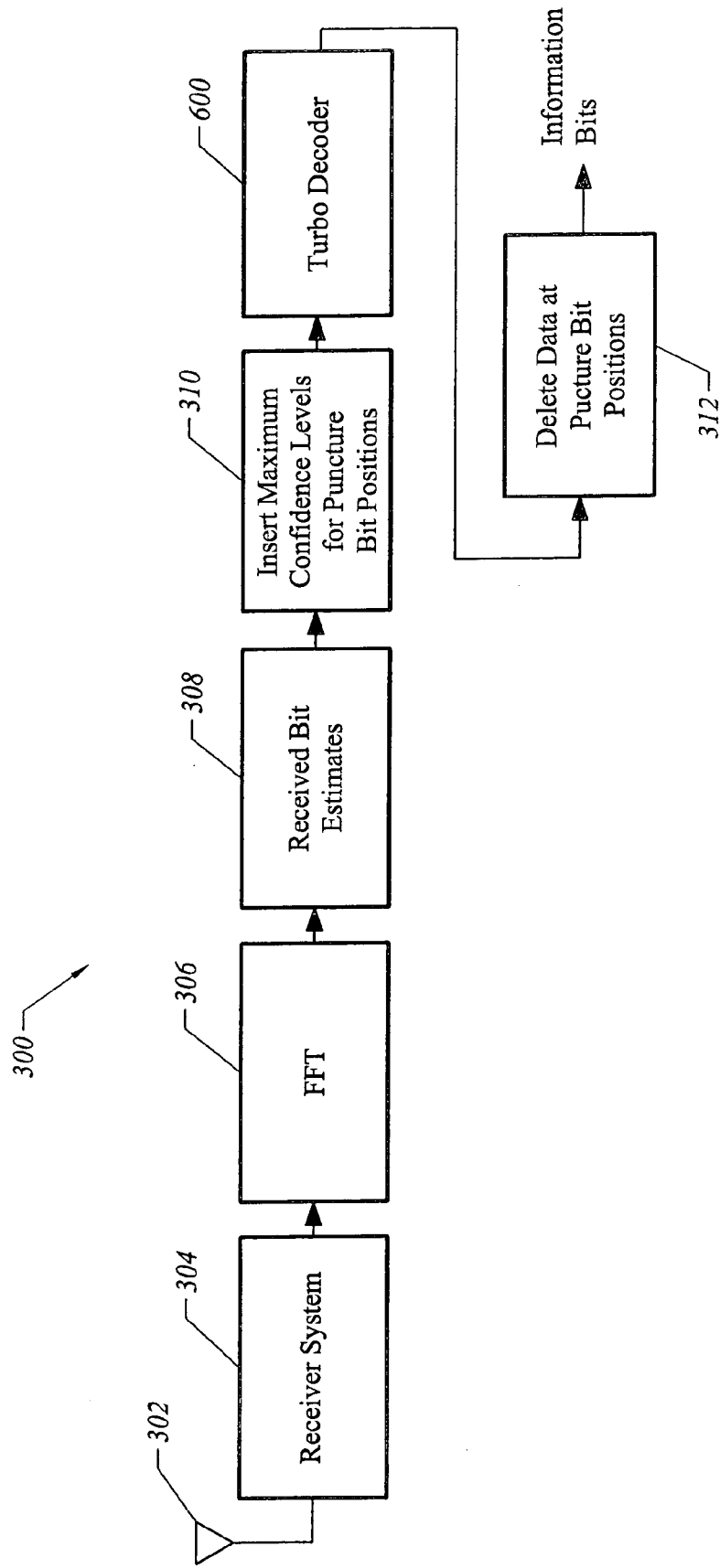
FIG. 3 depicts a block diagram of a receiver according to one embodiment of the present invention.

FIG. 3 depicts a receiver 300 according to one embodiment of the present invention. Receiver 300 may be implemented in central access point 102 for example. Radio frequency signals are incident on an antenna 302. The radio frequency signals are subject to low noise amplification and downconversion to an intermediate frequency within a receiver system 304. Receiver system 304 further filters and processes the intermediate frequency signal and converts it down to baseband. At baseband, the analog signal is converted to a stream of digital symbols. In an OFDM embodiment, an FFT block 306 removes a cyclic prefix from successive bursts of time domain OFDM symbols and applies the Fast Fourier Transform to recover transmitted frequency domain symbols. Each symbol represents multiple bits. An estimation processor 308 assigns soft decision values to each received bit.

The received bit soft decision values output by block 308 will correspond to information bits and parity bits in the scheme of FIG. 7. A puncture bit insertion block 310 injects soft decision values corresponding to the known puncture bit values used at the transmit end. The soft decision values used for puncture bit positions correspond to a maximum confidence level since their values are not subject to noise and interference in the communication system. Alternatively, hard decision values may be used for both puncture bits and information bits.

Puncture bit insertion block 310 then presents the data bit soft decision estimates including the puncture bit estimates as input to turbo decoder 600. Turbo decoder 600 outputs estimated values for each of the data bits. A puncture bit deletion block 312 then deletes the bits at the puncture bit positions and leaves only the information bits for further processing which may include further decoding such as Reed-Solomon decoding.

While the above is a complete description of certain embodiments of the invention, alternatives, modifications, and equivalents may be used. It should be evident the invention is equally applicable by making appropriate modifications to the embodiments described above. For example, decoding and encoding schemes described above may be used in communications system other than OFDM systems or in systems other than communication systems such as data storage systems. Also, the technique described here of inserting extra bits having predetermined values at a systematic coder input, deleting these bits at the coder output and then reinserting them at the decoder input at the receive end can be applied to non-iterative coding schemes that employ soft decision values in decoding. Therefore, the above description should not be taken as limiting the scope of the invention that is defined by the metes and bounds of the appended claims along with their full scope of equivalents.

The invention claimed is:

1. In a digital communication system, an apparatus for encoding information prior to transmission, said apparatus comprising:
   means for providing a systematic coder that receives data bits as input and provides parity bits as output;
   means for using said information to specify values of selected ones of said data bits to be information bits while other ones of said data bits are puncture bits and carry predetermined values;
   means for operating said systematic coder to generate said parity bits based on said information bits and said puncture bits; and
   means for transmitting said information bits and said parity bits as output by said systematic coder without transmitting said puncture bits.

2. The apparatus of claim 1 further comprising:
   means for setting a ratio of said information bits to said puncture bits to vary an effective code rate of said systematic coder.

3. The apparatus of claim 2 wherein said means for transmitting comprises:
   means for generating an OFDM time domain burst based on said data bits as specified and said parity bits;
   and wherein said code rate is set so that a specified size block of said information fills an information portion of said OFDM time domain burst.

4. The method of claim 1 wherein said systematic coder comprises a turbo coder and said means for operating said systematic coder comprises:
   means for inputting a series of row words of said data bits into a first block coder;
   means for encoding, using said first block coder, to form at least one parity bit per row word;
   means for interleaving bits of said row words as augmented to form a series of column words;
   means for inputting said series of column words into a second block coder;
   means for encoding, using said second block coder, to form at least one parity bit per column word; and
   means for outputting said data bits with parity bits formed by said first block coder and said second block coder.

5. In a digital communication system, an apparatus for decoding information after reception, said apparatus comprising:
   means for providing a systematic decoder that receives as input estimation information for data bits and parity bits and outputs values for said data bits as corrected by use of said parity bits;

means for generating estimation information for said parity bits and selected ones of said data bits based on a received signal;

means for generating estimation information for other ones of said data bits based on predetermined values as were input to a transmitter encoder;

means for inputting said estimation information based on said received signal and said estimation information based on said predetermined values into said systematic decoder; and means for operating said systematic decoder to recover estimates of said selected ones of data bits.

6. The apparatus of claim 5 wherein said estimation information input to said systematic decoder comprises hard decision values for said data bits and said parity bits.

7. The apparatus of claim 5 wherein said estimation information input to said systematic decoder comprises soft decision values for said data bits and said parity bits.

8. The apparatus of claim 7 wherein said estimation information for said other ones of said data bits comprises maximum confidence soft decision values.

9. In a digital communication system, an apparatus for encoding information prior to transmission, said apparatus comprising:

a turbo coder that receives data bits as input and provides parity bits as output, selected ones of said data bits being information bits carrying said information while other ones of said data bits are puncture bits and carry predetermined values; and a connection to a transmitter system that forwards said information bits and parity bits for transmission but not said puncture bits.

10. In a digital communication system, an apparatus for encoding information prior to transmission, said apparatus comprising:

a turbo coder that receives data bits as input and provides parity bits as output;

means for using said information to specify values of selected ones of said data bits to be information bits while other ones of said data bits are puncture bits and carry predetermined values;

means for operating said turbo coder to generate said parity bits based on said information bits and said puncture bits; and means for transmitting said information bits and said parity bits as output by said systematic coder without transmitting said puncture bits.

11. In a digital communication system, a method for encoding information prior to transmission, said method comprising:

providing a turbo coder that receives data bits as input and provides parity bits as output;

using said information to specify values of selected ones of said data bits to be information bits while other ones of said data bits are puncture bits and carry predetermined values;

operating said turbo coder to generate said parity bits based on said information bits and said puncture bits; and transmitting said information bits and said parity bits as output by said turbo coder without transmitting said puncture bits.

* * * * *